United States Patent
Bell (10) Patent No.: US 11,929,421 B2
(45) Date of Patent: Mar. 12, 2024

(54) ISOTOPE-MODIFIED HAFNIUM AND SEMICONDUCTOR DIELECTRICS

(71) Applicant: James Dalton Bell, Vancouver, WA (US)

(72) Inventor: James Dalton Bell, Vancouver, WA (US)

( * ) Notice: Subject to any disclaimer, the term of this patent is extended or adjusted under 35 U.S.C. 154(b) by 0 days.

(21) Appl. No.: 17/232,016

(22) Filed: Apr. 15, 2021

(65) Prior Publication Data

US 2021/0336027 A1  Oct. 28, 2021

Related U.S. Application Data

(60) Provisional application No. 63/053,689, filed on Jul. 19, 2020, provisional application No. 63/016,217, filed on Apr. 27, 2020.

(51) Int. Cl.
| | |
|---|---|
| *H01L 29/51* | (2006.01) |
| *H01G 4/10* | (2006.01) |
| *H01L 49/02* | (2006.01) |
| *C01G 27/02* | (2006.01) |

(52) U.S. Cl.
CPC ............ *H01L 29/517* (2013.01); *H01G 4/10* (2013.01); *H01L 28/60* (2013.01); *C01G 27/02* (2013.01)

(58) Field of Classification Search
CPC ......... H01L 29/517; H01L 28/60; H01G 4/10; C01G 27/02
See application file for complete search history.

(56) References Cited

U.S. PATENT DOCUMENTS

| | | | |
|---|---|---|---|
| 4,202,741 | A | 5/1980 | Hartford, Jr. et al. |
| 5,144,409 | A | 9/1992 | Ma |
| 5,442,191 | A | 8/1995 | Ma |
| 6,097,079 | A | 8/2000 | Hossain et al. |
| 6,437,392 | B1 | 8/2002 | Schneemeyer et al. |
| 7,224,435 | B2 | 5/2007 | Sogard |
| 7,494,888 | B2 | 2/2009 | Gammel et al. |
| 7,687,025 | B2 | 3/2010 | Tillotson |
| 9,503,046 | B2 | 11/2016 | Sinha et al. |
| 10,388,848 | B2 | 8/2019 | Thomas et al. |
| 2003/0039865 | A1 | 2/2003 | Kelsey et al. |
| 2016/0322506 | A1 | 11/2016 | Yamazaki |

(Continued)

FOREIGN PATENT DOCUMENTS

JP    2010129739 A    6/2010

OTHER PUBLICATIONS

Machine Translation of JP 2010129739 A. (Year: 2010).*

(Continued)

*Primary Examiner* — Melissa S Swain
*Assistant Examiner* — Catriona M Corallo
(74) *Attorney, Agent, or Firm* — J. Douglas Wells; Alleman Hall & Tuttle LLP (57) ABSTRACT

Various methods and systems are provided for facilitating the creation of a new and potentially thinner form of dielectric. Alternatively, for a given capacitance, a thicker layer can be created with lower risk of leakage. The present disclosure will enable the creation of physically smaller electronic components. Isotope-Modified Hafnium Dielectric is used to create a dielectric layer with a greater range of dielectric coefficients, which may enable the creation of smaller and/or more reliable electronic components.

18 Claims, 7 Drawing Sheets

(56) References Cited

U.S. PATENT DOCUMENTS

2019/0043968 A1 2/2019 Lampert et al.

OTHER PUBLICATIONS

ISA United States Patent and Trademark Office, International Search Report and Written Opinion Issued in Application No. PCT/US2021/028902, dated Aug. 5, 2021, WIPO, 10 pages.
Seabaugh, A., "The Tunneling Transistor: Quantum tunneling is a limitation in today's transistors, but it could be the key to future devices," IEEE Spectrum Website, Available Online at https://spectrum.IEEE.org/semiconductors/devices/the-tunneling-transistor, Sep. 30, 2013, 9 pages.
"Samsung Leads Semiconductor Paradigm Shift with New Material Discovery," Samsung Website, Available Online at https://news.samsung.com/global/samsung-leads-semiconductor-paradigm-shift-with-new-material-discovery, Jul. 6, 2020, 3 pages.

\* cited by examiner

| Isotope Atomic Weight | Atomic Percent | Nuclear Spin | Nuclear Magnetic Moment | |
|---|---|---|---|---|
| 90Zr | 51.45 (40) | 0 | 0 | ←300 302 |
| 91Zr | 11.22 (5) | 5/2 | -1.30362 | ←304 |
| 92Zr | 17.15 (8) | 0 | 0 | ←306 |
| 94Zr | 17.38 (28) | 0 | 0 | ←308 |
| 96Zr | 2.80 (9) | 0 | 0 | ←310 |

FIG. 3

| Isotope Atomic Weight | Atomic Percent | Nuclear Spin | Nuclear Magnetic Moment |
|---|---|---|---|
| 28Si | 92.2297 | 0 | 0 |
| 29Si | 4.6832 | 1/2 | -0.55529 |
| 30Si | 3.0872 | 0 | 0 |

| Isotope Atomic Weight | Atomic Percent | Nuclear Spin | Nuclear Magnetic Moment | |
|---|---|---|---|---|
| 16 O | 99.757 | 0 | 0 | ←602 |
| 17 O | 0.038 | 5/2 | -1.89380 | ←604 |
| 18 O | 0.205 | 0 | 0 | ←606 |

ISOTOPE-MODIFIED HAFNIUM AND SEMICONDUCTOR DIELECTRICS

CROSS-REFERENCE TO RELATED APPLICATIONS

The present application claims priority to U.S. Provisional Application No. 63/016,217, entitled "ISOTOPE-MODIFIED HAFNIUM DIELECTRIC," and filed on Apr. 27, 2020. This present application also claims priority to U.S. Provisional Application No. 63/053,689, entitled "ISOTOPE-MODIFIED HAFNIUM DIELECTRIC," and filed on Jul. 19, 2020. The entire contents of the above-listed applications are hereby incorporated by reference for all purposes.

FIELD

Embodiments of the subject matter disclosed herein relate to electronic devices, such as transistor-gates or capacitor dielectrics.

BACKGROUND

Embodiments involve the creation of a new dielectric medium between two electrical conducting surfaces, for example: between a gate and channel of a metal-oxide-semiconductor field-effect transistor (MOSFET). The term MOSFET includes transistors with a gate made of metal (e.g. aluminum or copper) or a gate made of non-metal (e.g., Silicon, or an alloy of silicon).

Electrical current flows to and through one electrical conductor, called a gate, which is charged to a voltage and is separated from another conductor, called a semiconductor (transistor) channel, by an electrically-insulating dielectric. As the voltage on the gate changes, the electrostatic field passes through the dielectric insulator and a phenomenon called 'transconductance' varies the flow of current in the semiconductor channel.

Various dielectric mediums have been used over the years. Silicon Dioxide and/or Silicon Nitride compounds have been in wide use since the 1960's, and are still used for many applications. These formulations have become unsatisfactory as the linewidths and feature sizes of integrated circuits have become far smaller. In an effort to produce ever-smaller electronic components, compounds that include Hafnium and/or Zirconium are used by some manufacturers to create a dielectric medium which allows the adequate control of the current in a semiconductor channel, but is not so thin (about 1.2 nanometers thick) so as to allow a phenomenon known as 'quantum tunneling' to allow electrical leakage between the gate and semiconductor channel.

BRIEF DESCRIPTION

The present disclosure comprises the substitution of Hafnium isotopes for ordinary-isotope Hafnium in an isotopic proportion different than that which occurs in nature. Hafnium atoms (symbol Hf, atomic number 72) have an average mass of 178.49 atomic mass units (amu). The isotopes of Hafnium primarily used in the present disclosure have a mass 177 and 179. The isotopes whose nuclei possess nuclear spin are Hf-177 and Hf-179. These two isotopes have a neutron which is not paired with another neutron. Thus, there is a neutron with a low orbit around the nucleus of the atom, and so the positively-charged rest of the nucleus orbits around an exceedingly tiny loop. Thus, those nuclei behave as a tiny magnetic dipole. By increasing the relative isotopic amounts of Hf-177 and/or Hf-179 compared to the other Hafnium isotopes present, different (including higher) dielectric constants may be achieved, and thus thicker layers of dielectric medium can be used, yet achieving adequate control ("gate authority") over the electrical current in the semiconductor channel, which enables smaller electronic components.

Existing processes can be used to separate the Hf-177 and the Hf-179 from Hafnium with other mass numbers. Technical processes, for example the Calutron, are used to separate the various Hafnium isotopes. Together, Hf-177 and Hf-179 make up approximately 32% of the isotope distribution of natural Hafnium. See website webelements.com Current integrated circuit manufacturing processes make a layer of insulating dielectric comprising a portion of Hafnium, which contains the naturally-occurring distribution of Hafnium normally found in nature. The dielectric layer has a thickness which varies with the specific manufacturing process selected, and typically is 1 to 10 nanometers thick.

By using either Hf-177 with a higher proportion than is found in nature or by using Hf-179 with a higher proportion than is found in nature, the dielectric constant of the resulting insulating layer can be varied from what it would be if natural-isotope-proportion Hafnium had been used.

So, the dielectric can have a higher capacitance, in comparison with its normal thickness, than a natural-isotope Hafnium-containing layer would have. This allows the use of thicker layers of dielectric, resulting in less tunneling-leakage, yet providing the ability to control the current through the conductive channel of the transistor.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

The following description relates to various embodiments of an Isotope-Modified Dielectric.

Figure 1:
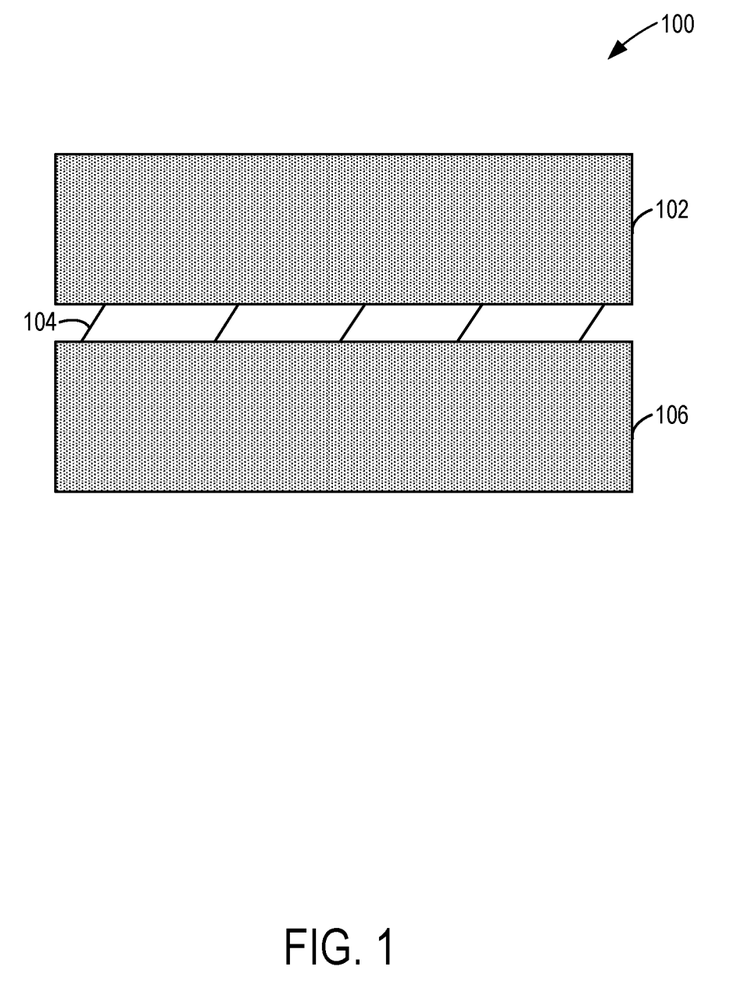
FIG. 1 shows a diagram of a layer of Isotope-Modified Hafnium Dielectric between two layers of electrically conducting material.

Turning first to FIG. 1, an Isotope-Modified Hafnium Dielectric 100 is shown. The Isotope-Modified Hafnium Dielectric 100 includes a top conducting material 102, a chemical compound 104, and a bottom conducting material 106. Both the top conducting material 102 and bottom conduction material 106 may be an electrically conducting material. The chemical compound 104 may be placed between the top conducting material 102 and the bottom conducting material 106. The chemical compound 104 may include the chemical element Hafnium, and may include a greater or lesser percentage of either HF-177 and/or HF-179, than found in nature, which will be elaborate below. However, ordinarily the dielectric-constant benefit of Hf-177 and Hf-179 will neutralize each other, so a manufacturer will probably not wish to include both isotopes in the same insulator. In alternative embodiments, the chemical compound may be one or more of the chemical elements Hafnium, Zirconium, Barium, Oxygen, Titanium, Nitrogen, Silicon, Selenium, Sulfur, and/or Tellurium, which will be elaborated below.

Figure 2:
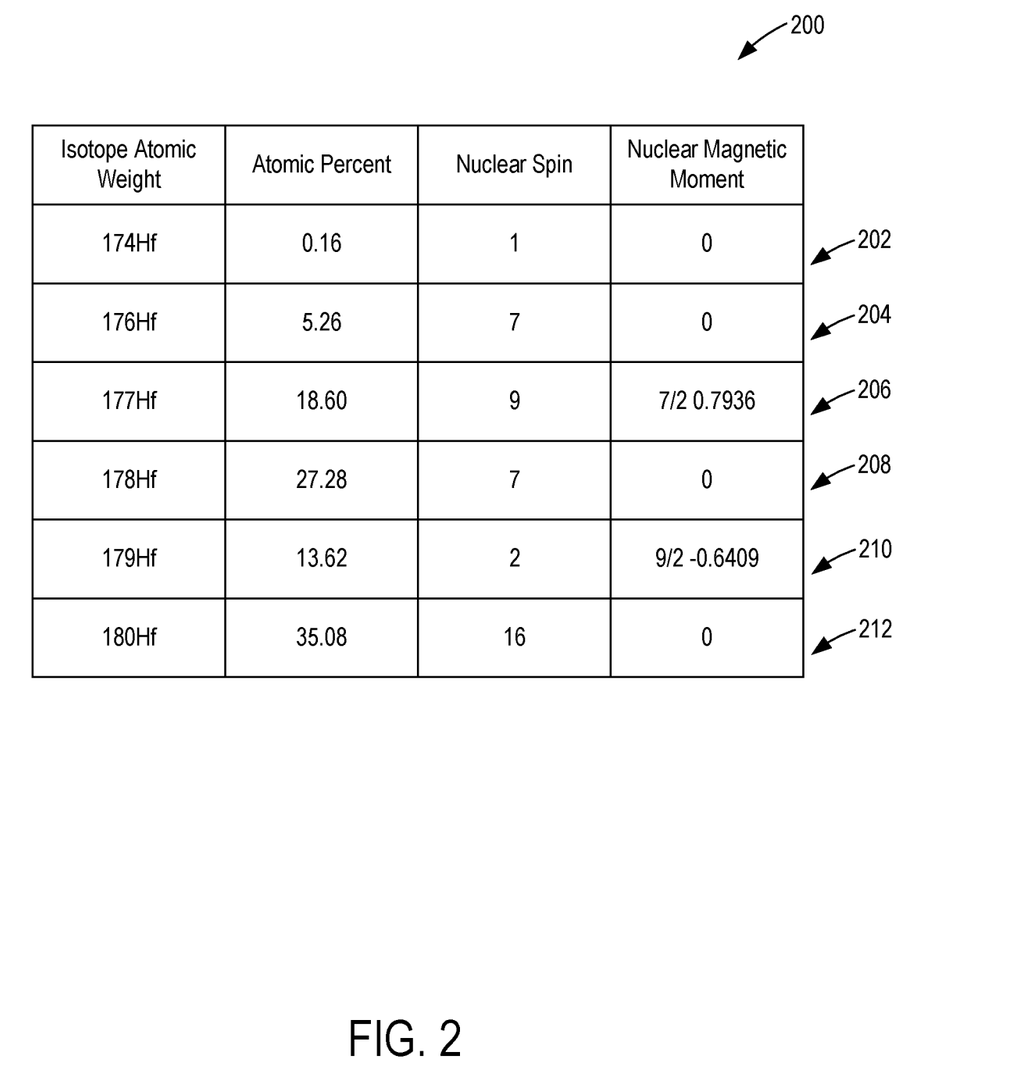
FIG. 2 shows a table detailing atomic percentage, nuclear spin, and nuclear magnetic moment for Hafnium isotopes.

Moving now to FIG. 2, a table 200 shows the natural isotopic mixture of Hafnium, which consists of six stable isotopes of Hafnium. For each of the six stable isotopes of Hafnium, an isotope atomic weight, an atomic percent found in nature (shown on table 200 as Atomic Percent), a nuclear spin, and a nuclear magnetic moment are shown as columns on table 200. A row 202 shows the properties of Hafnium-174, which may also be referred to herein as 174Hf or HF-174. A row 204 shows the properties of Hafnium-176, which may also be referred to herein as 176Hf or Hf-176. A row 206 shows Hafnium-177, which may also be referred to herein as 177Hf and/or Hf-177. A row 208 shows the properties of Hafnium-178, which may also be referred to herein as 178Hf and/or Hf-178. A row 210 shows the properties of Hafnium-179, which may also be referred to herein as 179Hf and/or Hf-179. A row 212 shows the properties of Hafnium-180, which may also be referred to herein as 180Hf and/or Hf-180. Only Hf-177 and Hf-179 have non-zero electromagnetic spins.

Figure 3:
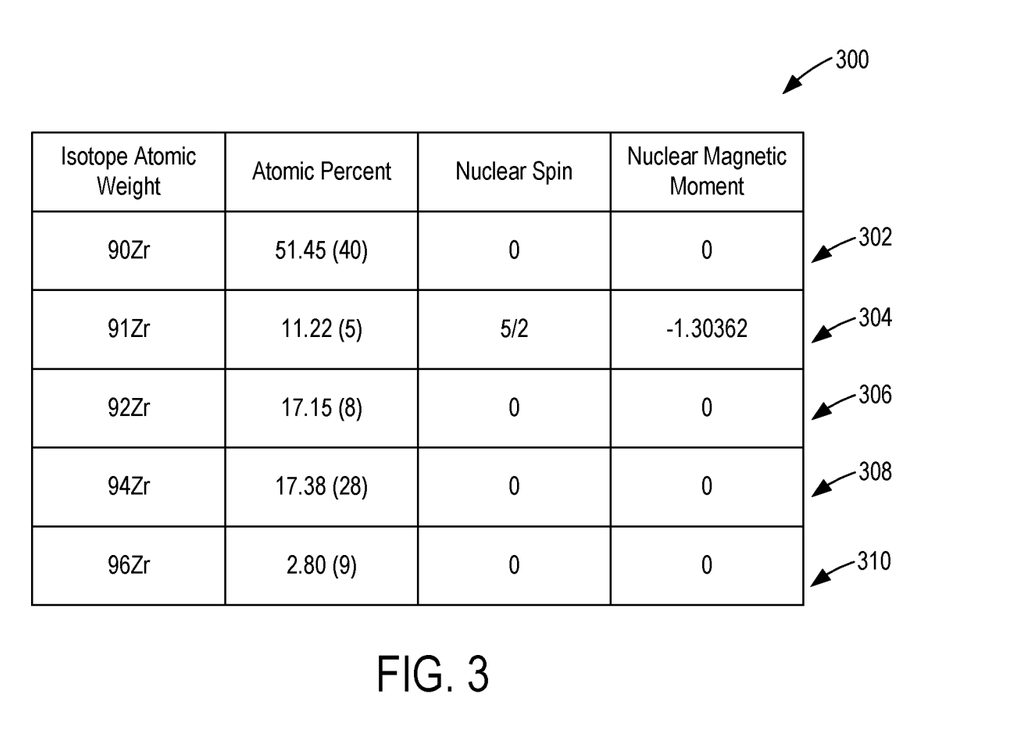
FIG. 3 shows a table detailing atomic percentage, nuclear spin, and nuclear magnetic moment for Zirconium isotopes.

Continuing now to FIG. 3, a table 300 shows the natural isotopic mixture of Zirconium, which consists of five stable isotopes of Zirconium. For each of the five stable isotopes of Zirconium, an isotope atomic weight, an atomic percent found in nature (shown on table 300 as Atomic Percent), a nuclear spin, and a nuclear magnetic moment are shown as columns on table 300. A row 302 shows the properties of Zirconium-90, which may also be referred to herein as 90Zr and/or Zr-90. A row 304 shows the properties of Zirconium-91, which may also be referred to herein as 91Zr and/or Zr-91. A row 306 shows the properties of Zirconium-92, which may also be referred to herein as 92Zr and/or Zr-92. A row 308 shows the properties of Zirconium-94, which may also be referred to herein as 94Zr and/or Zr-94. A row 310 shows the properties of Zirconium-96, which may also be referred to herein as 96Zr and/or Zr-96. Only Zr-91 has a non-zero electromagnetic spin.

Figure 4:
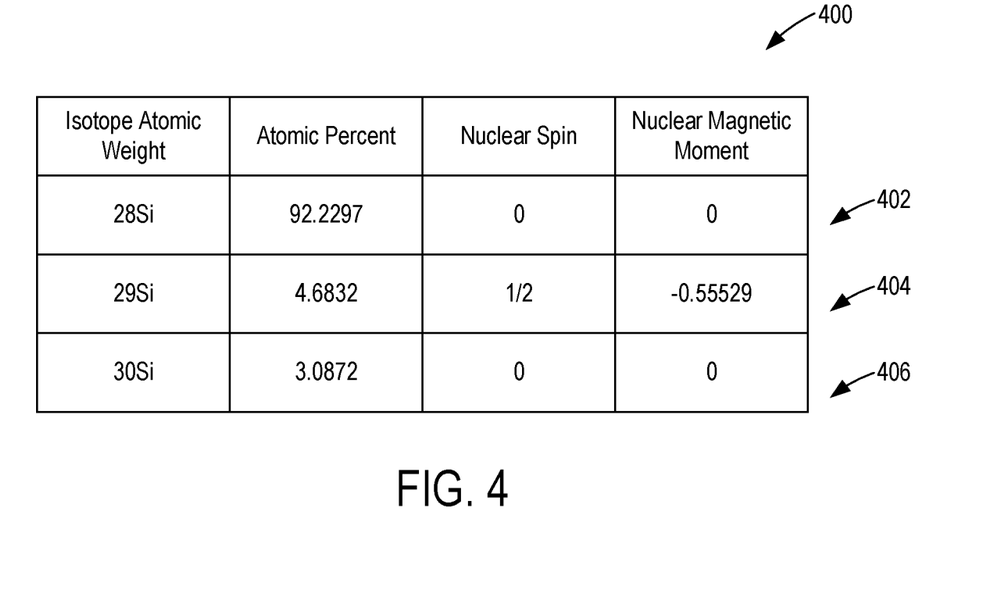
FIG. 4 shows a table detailing atomic percentage, nuclear spin, and nuclear magnetic moment for Silicon isotopes.

Moving now to FIG. 4, a table 400 shows the natural isotopic mixture of Silicon, which consists of three stable isotopes of Silicon. For each of the three stable isotopes of Silicon, an isotope atomic weight, an atomic percent found in nature (shown on table 400 as Atomic Percent), a nuclear spin, and a nuclear magnetic moment are shown as columns on table 400. A row 402 shows the properties of Silicon-28, which may also be referred to herein as 28Si and/or Si-28. A row 404 shows the properties of Silicon-29, which may also be referred to herein as 29Si and/or Si-29. A row 404 shows the properties of Silicon-30, which may also be referred to herein as 30Si and/or Si-30. Only Si-29 has a non-electromagnetic spin.

Figure 5:
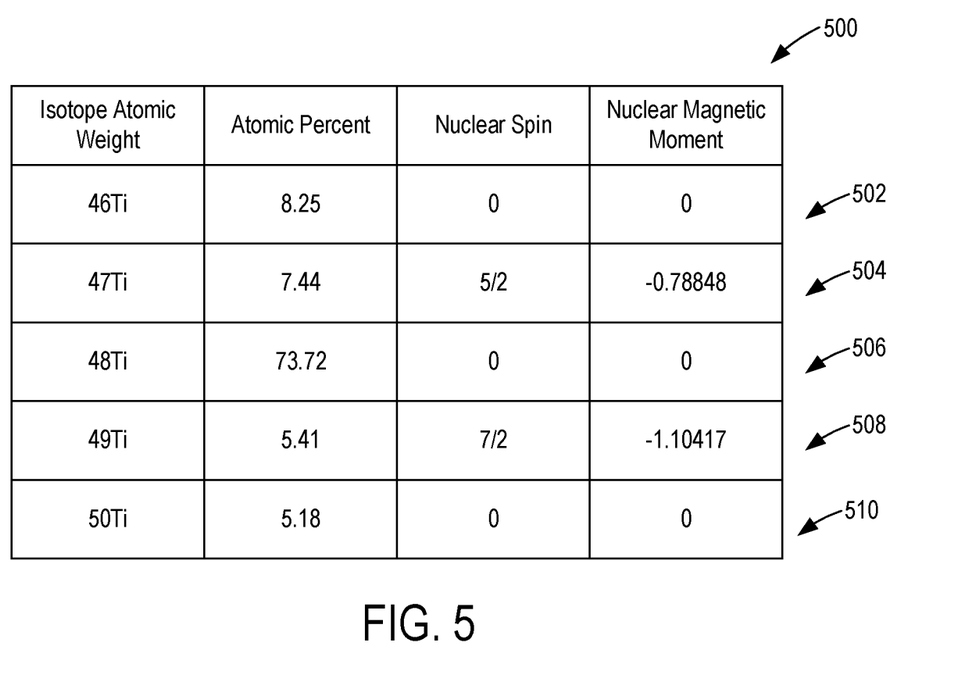
FIG. 5 shows a table detailing atomic percentage, nuclear spin, and nuclear magnetic moment for Titanium isotopes.

Turning now to FIG. 5, a table 500 shows the natural isotopic mixture of Titanium, which consists of five stable isotopes of Titanium. For each of the five stable isotopes of Titanium, an isotope atomic weight, an atomic percent found in nature (shown on table 500 as Atomic Percent), a nuclear spin, and a nuclear magnetic moment are shown as columns on table 500. A row 502 shows the properties of Titanium-46, which may also be referred to herein as 46Ti and/or Ti-46. A row 504 shows the properties of Titanium-47, which may also be referred to herein as 47Ti and/or Ti-47. A row 506 shows the properties of Titanium-48, which may also be referred to herein as 48Ti and/or Ti-48. A row 508 shows the properties of Titanium-49, which may also be referred to herein as 49Ti and/or Ti-49. A row 510 shows the properties of Titanium-50, which may also be referred to herein as 50Ti and/or Ti-50. Only Ti-47 and Ti-49 have nuclei with non-zero electromagnetic spin.

Figure 6:
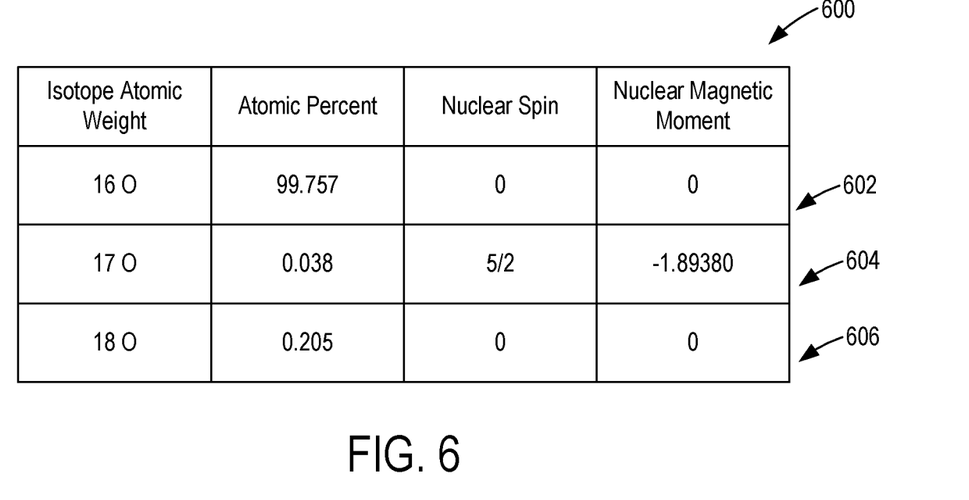
FIG. 6 shows a table detailing atomic percentage, nuclear spin, and nuclear magnetic moment for Oxygen isotopes.

Moving now to FIG. 6, a table 600 shows the natural isotopic mixture of Oxygen, which consists of three stable isotopes of Oxygen. For each of the three stable isotopes of Oxygen, an isotope atomic weight, an atomic percent found in nature (shown on table 600 as Atomic Percent), a nuclear spin, and a nuclear magnetic moment are shown as columns on table 600. A row 602 shows the properties of Oxygen-16, which may also be referred to herein as 16O and/or O-16. A row 604 shows the properties of Oxygen-17, which may also be referred to herein as 17O and/or O-17. A row 606 shows the properties of Oxygen-18, which may also be referred to herein as 18O and/or O-18. Only O-17 has non-zero electromagnetic spin.

Figure 7:
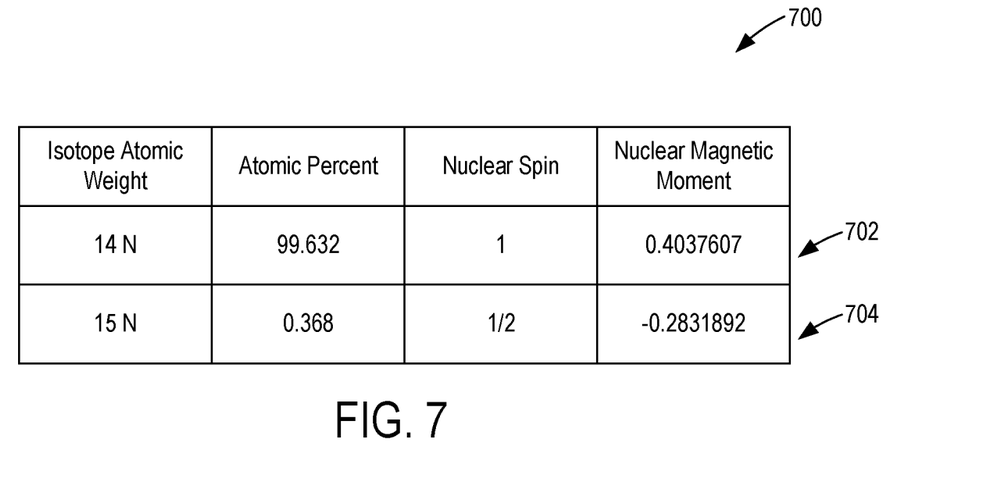
FIG. 7 shows a table detailing atomic percentage, nuclear spin, and nuclear magnetic moment for Nitrogen isotopes.

Moving now to FIG. 7, a table 700 shows the natural isotopic mixture of Nitrogen, which consists of two stable isotopes of Oxygen. For each of the two stable isotopes of Oxygen, an isotope atomic weight, an atomic percent found in nature (shown on table 700 as Atomic Percent), a nuclear spin, and a nuclear magnetic moment are shown as columns on table 700. A row 702 shows the properties of Nitrogen-14, which may also be referred to herein as 14N and/or N-14. A row 704 shows the properties of Nitrogen-15, which may also be referred to herein as 15N and/or N-15. Both N-14 and N-15 have electromagnetic spin, but the values for those spins and magnetic moments are different from each other. Further, the magnetic moment of N-14 is positive, while the magnetic moment of N-15 is negative.

In one embodiment, an Isotope-Modified Hafnium Dielectric may be achieved by constructing any dielectric compound comprised of any solid used as an electrical dielectric, which contains in part the chemical element Hafnium, in which the isotopic distribution of the atoms of Hafnium varies from the isotopic distribution of Hafnium found occurring in natural deposits on earth. For example, use of 177Hf in proportion may be higher than the 18.60% atomic percent found in nature. As another example, use of 179Hf in proportion may be higher than 13.62% atomic percent found in nature. As further examples, use of 177Hf in isotopic proportion may be lower than 18.60% and/or use of 179-Hf may be lower than the 13.62% atomic percent found in nature.

Additionally, the dielectric material may also include Oxygen, and use of Oxygen-17 isotope in isotopic proportion may be higher or lower than nature's 0.038% atomic percent. However, the dielectric constant benefit of employing increased Oxygen-17 isotope may neutralize the benefit of Hf-177 since the 'magnetic moments' are of opposite polarities. (Magnetic moment of Hf-177 is positive, while the magnetic moment of O-17 is negative. The magnetic moment of Hf-179 is negative.) Thus, it is expected that the Isotope-Modified Hafnium Dielectric may be used as a capacitor dielectric between two capacitor electrodes, which may be two electrically conductive components. The Isotope-Modified Hafnium Dielectric may also be a gate dielectric in a MOSFET transistor.

The Hafnium compounds commonly used in Integrated Circuits as dielectrics have a dielectric constant (e.g., coefficient) ranging from 16 to 25. In comparison, the dielectric constant of air is 1, and the dielectric constant of SiO2 (Silicon Dioxide) ranges from 3.7 to 3.9. Typically, the thickness of gate insulator which begins to be a problem is 1.2 nanometers or less. The dielectric constant of Hafnium compounds may increase if the Hafnium isotope has a nuclear spin to it. With an increased dielectric constant, and the increased gate-thickness which is allowed, the probability of quantum tunneling decreases. Thus, by using isotope-modified Hafnium within the Isotope-Modified Hafnium Dielectric, the amount of Hafnium, and thus the thickness of the Isotope-Modified Hafnium Dielectric, may be made greater than alternative chemical elements and thus reducing quantum tunneling.

In another embodiment, an Isotope-Modified Zirconium Dielectric may be achieved by constructing any dielectric compound comprised of any solid used as an electrical dielectric, which contains in part the chemical element Zirconium, in which the isotopic distribution of the atoms of Zirconium varies from the isotopic distribution of Zirconium found occurring in natural deposits on earth. For example, the use of 91Zr isotope in proportion may be higher or lower than the 11.22% atomic percent found in nature. Similar to the Hafnium embodiment described above, the Isotope-Modified Zirconium Dielectric may contain Oxygen where the Oxygen has an isotopic proportion of Oxygen-17 at an isotopic proportion that may be greater or less than Oxygen-17 isotopic proportion of 0.038% found in nature. Zr-91 isotope has a magnetic moment which is negative, and O-17 isotope also has a magnetic moment which is negative, so the dielectric-constant benefits of these isotopes should add. Additionally, an electronic device may incorporate the Isotope-Modified Zirconium Dielectric as a capacitor dielectric between two capacitor electrodes. The electronic device, which may include or not include an Oxygen-17 isotope modification from the isotopic proportion normally present in nature between two electrically conductive components, may use the Isotope-Modified Zirconium Dielectric as a gate dielectric in a MOSFET transistor.

In a different embodiment, an Isotope-Modified Barium Dielectric may be achieved by constructing any dielectric compound comprised of any solid used as an electrical dielectric, which contains in part the chemical element Barium, in which the isotopic distribution of the atoms of Barium varies from the isotopic distribution of Barium found occurring in natural deposits on earth. For example, use of 135Ba isotope in proportion may be higher or lower than 6.592% atomic percent and/or Barium-137 in higher or lower than 11.232% atomic percent found in nature. However, the magnetic moment of O-17 is negative, and the magnetic moment of Ba-135 and Ba-137 is positive, so the dielectric-constant-increasing effects of combining these two types of isotopes can be expected to counteract and neutralize. The Isotope-Modified Barium Dielectric may be used as a capacitor dielectric between two capacitor electrodes, and an electronic device may incorporate the Isotope-Modified Barium Dielectric between two electrically conductive components. Furthermore, the electronic device may use the Isotope-Modified Barium Dielectric as a gate dielectric in a MOSFET transistor.

In one embodiment, an Isotope-Modified Titanium Dielectric may be achieved by constructing any dielectric compound comprised of any solid used as an electrical dielectric, which contains in part the chemical element Titanium, in which the isotopic distribution of the atoms of Titanium varies from the isotopic distribution of Titanium found occurring in natural deposits on earth. For example, use of 47Ti isotope in proportion may be higher or lower than 5.41% atomic percent or the use of Ti-49 7.44% found in nature. The Isotope-Modified Zirconium Dielectric may also contain Oxygen where said Oxygen has an isotopic proportion of Oxygen-17 at an isotopic proportion greater or less than nature's Oxygen-17 isotopic proportion of 0.038%. The magnetic moments of both Ti-47 and Ti-49 are negative, as is the magnetic moment of O-17, so the dielectric-constant adding effect can be expected to add together. Additionally, the Isotope-Modified Titanium Dielectric may be used within an electric device as a capacitor dielectric between two capacitor electrodes, which may be two electrically conductive components. Within the electronic device, the Isotope-Modified Titanium Dielectric may be used as a gate dielectric in a MOSFET transistor.

In one embodiment, the isotope-modified dielectric materials mentioned in the above embodiments, semiconductor material, or region on an IC (Integrated circuit) may also contain the chemical element Sulfur. For example, the isotopic proportion of the Sulfur-33 isotope atoms therein may vary either greater or less than the range of isotopic proportion of Sulfur-33 isotope atoms normally found in nature.

For the embodiments mentioned above, an isotopically modified volatile precursor chemical, with a component of one or more of Hafnium, Zirconium, Titanium, or Barium, Oxygen, Nitrogen, Silicon, Selenium, Sulfur, or Tellurium, may be used to deposit the isotopically modified dielectrics, as described in the embodiments above, on Silicon, semiconductor wafers, or other solid surfaces.

In another embodiment, the isotope-modified non-dielectric material, semiconductor material, or region on an IC may contain the chemical elements Sulfur and Molybdenum, in which the isotopic proportion of the Molybdenum isotope atoms may vary from the range of isotopic proportion of Molybdenum isotope atoms found in nature, or the Sulfur isotope atoms therein may vary from the range of isotopic proportion of Sulfur isotope atoms found in nature, or, where the isotopic proportion of Molybdenum atoms and the isotopic proportion of Sulfur atoms both vary from their respective ranges normally found in nature. This combination, MoS2, can be used as a monolayer, or two or three atomic layers, as a semiconductor device, reducing or increasing the isotopic proportions of either or both Mo-95 or Mo-97 isotopes, or reducing or increasing the isotopic proportions of S-33 isotope.

In some embodiments, any isotope modified semiconductor material or region used in the IC mentioned above may be used as a transistor (e.g., Field-Effect Transistor or FET) channel, containing both Molybdenum and Sulfur, in which one or more of the isotopic proportions of Molybdenum-95, Molybdenum-97, and Sulfur-33 may be lowered or raised from the isotopic proportions of Molybdenum-95, Molybdenum-97, and Sulfur-33 isotope found in nature. The isotope-modified semiconductor material or region on the IC may be underlain by an electrically insulating layer (such as SiO2, Silica) that contains at least both the chemical elements Sulfur and Molybdenum. The isotopic proportion of the Molybdenum isotope atoms on the electrically insulating layer may vary from the range of isotopic proportion of Molybdenum isotope atoms found in nature, and/or the Sulfur-33 isotope atoms therein may vary from the range of isotopic proportion of Sulfur-33 isotope atoms found in nature.

In another embodiment, an isotope-modified non-dielectric material, or semiconductor material or region on an IC may contain the chemical elements Selenium and Molybdenum. That region may, or may not, be constructed as a mono-layer of atoms. The isotopic proportion of any of the Selenium isotope atoms and Molybdenum isotope atoms, or both, may vary from the range of isotopic proportions of Selenium and Molybdenum found in nature.

In a different embodiment, an isotope-modified conducting semiconductor material or region on an IC may be underlain by an electrically insulating layer (such as SiO2, Silica, or Al2O3), a conducting layer that may contain at least both the chemical elements Selenium and Molybdenum. In the electrically conducting layer, the isotopic proportion of the Molybdenum-95 or Molybdenum-97 isotope atoms may vary from the range of isotopic proportion of molybdenum isotope atoms found in nature, including a reduction of either or both Mo-95 and Mo-97, down to or including 0% isotopic proportion of those isotopes. Or the Selenium isotope atoms therein varies from the range of isotopic proportion of Selenium Se-77 isotope atoms found in nature. Or such a region in which both the Molybdenum and Selenium atoms isotopic proportions may vary from those found in Molybdenum and Selenium isotopic proportions normally found in nature. The purpose of a reduction of any, both, or all three of these isotopes is to reduce the scattering of the charge carriers moving in the MoSe2 layer, scattering which would be caused by atoms with spin-containing isotopic nuclei.

In some embodiments, an isotope-modified dielectric material, semiconductor material, or region on an IC may contain the isotope Selenium-77, in which the isotopic proportion of the Selenium-77 isotope atoms therein varies from the range of isotopic proportions of Selenium-77 found in nature. Additionally, isotope-modified dielectric material, semiconductor material, or region on the IC may be underlain or overlain by an electrically insulating region including SiO2, where there is a difference in the isotopic proportions of Si-29 or O-17.

In another embodiment, an isotope-modified dielectric material, semiconductor material, or region on an IC may contain the chemical element Tellurium, in which the isotopic proportion of any of the Tellurium isotope atoms therein varies from the range of isotope proportions of Tellurium isotope atoms found in nature.

In one embodiment, an isotope-modified dielectric material, semiconductor material, or region on an IC may contain the chemical element Molybdenum, and may include one or more of the following chemical elements: Sulfur, Selenium, Tellurium, or Oxygen, in which the isotopic proportion of Molybdenum isotope atoms (e.g., Molybdenum-95 and/or Molybdenum-97) therein varies from the isotopic proportions of Molybdenum atoms found in nature, and/or the isotopic proportions of the Sulfur, Selenium, Tellurium, or Oxygen atoms vary from the isotopic proportion of Sulfur, Selenium, Tellurium, or Oxygen atoms found in nature.

In a different embodiment, an isotope-modified dielectric material or semiconductor region on an IC may contain the chemical element Oxygen, in which the isotopic proportion of Oxygen-17 isotope atoms therein varies from the range of isotopic proportions of Oxygen-17 found in nature. For example, the isotopic proportion of Oxygen-17 isotope atoms may be above 0.050%, 0.50%, and/or 1% the total number of oxygen atoms. In another example, the isotopic proportion of the Oxygen-17 isotope atoms may be above 5.0%, 10.0%, and/or 20.0% the total number of oxygen atoms. In a further example, the isotopic proportion of the Oxygen-17 isotope atoms may be above 40.0%, 60.0%, or 80.0% of the total number of oxygen atoms. As one more example, the isotopic proportion of the Oxygen-17 isotope atoms may be 100.0% or less of the total number of oxygen atoms.

In one embodiment, an isotope-modified dielectric material or region on an IC may contain the chemical element Hafnium, and in addition, one or more of the following chemical elements: Zirconium, Titanium, Tantalum, Oxygen, Selenium, or Nitrogen, in which the isotopic proportion of the Hafnium isotope atoms therein varies from the isotopic proportions of Hafnium atoms found in nature, and/or the isotopic proportions of the Zirconium or Tantalum or Oxygen, Selenium, or Nitrogen atoms may vary from the isotopic proportion of Zirconium, Tantalum, Oxygen, Selenium, or Nitrogen atoms found in nature.

In a different embodiment, an isotope-modified dielectric material, semiconductor material, or region on an IC may contain the chemical element Zirconium, in which the isotopic proportion of the Zr-91 isotope atoms therein may vary from the isotope proportions of the Zr-91 isotope atoms found in nature. The modified dielectric material may also include the chemical element Oxygen, where the isotopic proportions of the Oxygen-17 atoms present may vary from the isotopic proportions found in nature.

In another embodiment, an isotope-modified dielectric material, semiconductor material, or region on an IC may include the chemical elements Oxygen and Silicon, in which the isotopic proportion of the Oxygen isotope atoms therein may vary from the isotope proportions of Oxygen found in nature. As an example, Oxygen-17 isotope within the isotope-modified dielectric material, semiconductor material, or region on the IC may vary as low as 0.060% isotopic proportion to as high as 100% isotopic proportion of Oxygen-17 atoms, or anywhere in between.

In one embodiment, an isotope-modified dielectric material, semiconductor material, or region on an IC may include the chemical elements Nitrogen and Silicon, in which the isotopic proportion of the Nitrogen atoms therein may vary from the isotope proportions of Nitrogen atoms found in nature. Additionally or alternatively, the isotopic proportion of the Silicon atoms therein may vary from the isotope proportions of Silicon atoms found in nature.

In a different embodiment, the following dielectric materials, SiO2 (Silicon Dioxide), Si3N4 (Silicon Nitride), Al2O3 (Aluminum Oxide), Y2O3 (Yttrium Oxide), Sc2O3 (Scandium Oxide), ZrO2 (Zirconium Oxide), HfO2 (Hafnium Oxide), La2O3 (Lanthanum Oxide), Ta2O5 (Tantalum Oxide), TiO2 (Titanium Dioxide), ZrSiO4 (Zirconium Silicate), HfSiO4 (Hafnium Silicate), YAlO3 (Yttrium Aluminate), HfAlO3 (Hafnium Aluminate), LaAlO3 (Lanthanum Aluminate), SrZrO3 (Strontium Zirconate) may be formed in a manner to be useable for an IC dielectric, in which the isotopic portion of one or more chemical elements mentioned above may vary from the isotopic proportion of these respective chemical elements found in nature. Additionally, atoms other than those included in the formulas above may be included in atomic proportions less than 5%.

Of the embodiments mentioned above including Silicon Dioxide, SiO2, in the dielectric material, the Silicon atoms and/or Oxygen atoms may be isotopically substituted with a greater or smaller isotopic proportion of Si-29 isotope atoms than is normally present in nature, and with a greater or smaller isotopic proportion of O-17 isotope atoms than is normally present in nature, respectively.

Additionally of the embodiments mention above including an IC made from a dielectric material described above, may use the dielectric material as an insulator between the gate of a transistor and a semiconductor channel of that transistor. In another example, the dielectric material may be used as an insulator between the two plates of a capacitor, or as an insulator between a current conductor and a metallic conductor or semiconductor.

In another embodiment, an Isotope-Modified Boron Nitride Dielectric may be achieved by constructing a dielectric compound comprised of boron and nitrogen, which may include at least 45% boron and at least 45% nitrogen atoms, by count of atoms, used as an electrical dielectric, which contains in whole or in part the chemical elements boron and nitrogen. The isotopic distributions of one or both of the atoms of Boron and Nitrogen may vary at least 1% from their isotopic distributions found in nature, on earth. For example, the isotopic distribution of the atoms of Boron-10 isotope may be greater than 21%, 30%, and/or 40% of the isotopic distribution of Boron-10 isotope found in nature. As another example, the isotopic distribution of the atoms of Boron-10 isotope may be greater than 50%, 60%, and/or 70% of the isotopic distribution of Boron-10 isotope found in nature. As a further example, the isotopic distribution of the atoms of Boron-10 isotope may be greater than 80% and/or 90% and equal to or less than 100% of the isotopic distribution of Boron-10 isotope found in nature. Additionally, Boron-11 may be included within the Isotope-Modified Boron Nitride Dielectric that may be greater than 81% and/or 90% or equal to or less than 100% of the isotopic distribution of Boron-11 found in nature. The Nitrogen-15 atoms included in the Isotope-Modified Boron Nitride Dielectric, for example, may be greater than 0.5%, 5%, and/or 10% of the percentage of Nitrogen atoms found in nature. As another example, the Nitrogen atoms may be greater than 20%, 30%, 40%, 50%, 60%, 70%, 80%, and/or 90% of the percentage of Nitrogen atoms found in nature. As a further example the Nitrogen atoms may be less than or equal to 100% of the percentage Nitrogen atoms found in nature. One superior formulation will be boron nitride in an amorphous form with a higher proportion of the rarer isotope B-10, and a higher proportion of the rarer isotope N-15. These proportions may be raised anywhere from just above their natural proportion, to 100% of either or both B-10 or N-15, or both.

The Isotope-modified Boron Nitride Dielectric may be, for example, constructed in a single-crystal or poly-crystalline structure. As another example, the Isotope-modified Boron Nitride Dielectric may be constructed with an amorphous structure or a monolayer graphene structure. Additionally, the Isotope-modified Boron Nitride Dielectric may have a decreased dielectric constant. In some instances, a decreased dielectric constant may be desirable, for example, in a dynamic ram. Within the dynamic RAM, a bit-line may connect to a bit-cell. The bit-cell may be desired to hold more electric charge and thus a higher electrical capacitance is desired, so it may be constructed with a higher-dielectric constant insulator. To not interfere with the bit-cell capacitance, the bit line is desired to have a lower capacitance and thus a lower dielectric constant is needed in the material surrounding the bit-line. Thus the Isotope-modified Boron Nitride Dielectric with a decreased dielectric constant may be used for the material surrounding and encapsulating the bit-line.

In another embodiment, an Isotope-Modified Carbon-Dopant Silica Dielectric may be achieved by including a carbon dopant into the silica, wherein Carbon-13 isotopic content of the carbon dopant is included in greater proportion than the 1.1% carbon-13 proportion content normally present in natural carbon. The Isotope-Modified Carbon-Dopant Silica Dielectric may be doped simultaneously by including either or both fluorine and carbon doping, where the Carbon-13 content of the carbon added to the silica is greater than the 1.1% atom/atom proportion normally present in natural carbon.

An IC made in part from the Isotope-Modified Carbon-Dopant Silica Dielectric and/or the Isotope-modified Boron Nitride Dielectric, inclusively, may use the dielectric as an electrical insulator between two plates of a capacitor, an electrical insulator between a current conductor and another current conductor material, an electrical insulator between a current conductor and a metallic conductor material, or as an insulator between a current conductor and a semiconductor material. These functions are intended to include Inter-Layer-Dielectrics.

In a last described embodiment, an isotope-modified dielectric material, semiconductor material, or region on an IC may include the chemical element Lanthanum, in which the isotopic proportion of the La-138 isotope atoms therein may vary from the isotope proportions of the La-138 isotope atoms found in nature. For example, 0.10%, 1.0%, and or 10%, of the atom/atom of lanthanum atoms. As another example, the proportion of the La-138 isotope in the lanthanum may be greater than 20%, greater than 30%, greater than 40%, greater than 50%, greater than 60%, greater than 70%, greater than 80%, and/or greater than 90% atom/atom of lanthanum atoms. As another example, the proportion of the La-138 isotope in the lanthanum may be less than or equal to 100% atom/atom.

Although the present invention has been described with reference to preferred embodiments, numerous modifications and variations can be made and still fall within the scope of the invention. For example, increasing or decreasing the scale of the preferred embodiment or increasing the number of instances of the preferred embodiment will still fall within the scope of the invention.

FIG. 1 shows example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

The technical effect of using an Isotope-modified Hafnium Dielectric is to allow the increase the thickness of a dielectric material used between two electrically conducting materials, if that thickness might otherwise be around or below a value of 1.2 nanometers.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An isotope-modified Hafnium dielectric comprising a dielectric material that includes a solid used as an electrical dielectric, the dielectric material comprising a chemical element Hafnium, in which an isotopic distribution of atoms of the Hafnium varies from an isotopic distribution of Hafnium found occurring in natural deposits on earth, and wherein the dielectric material comprises Oxygen, the Oxygen comprising Oxygen-17 isotope in an isotopic proportion higher or lower than nature's 0.038% atomic percent.

2. The isotope-modified Hafnium dielectric of claim 1, wherein the dielectric material comprises 177Hf in a proportion higher than nature's 18.60% atomic percent.

3. The isotope-modified Hafnium dielectric of claim 1, wherein the dielectric material comprises 179Hf in a proportion higher than nature's 13.62% atomic percent.

4. The isotope-modified Hafnium dielectric of claim 1, wherein the dielectric material comprises 177Hf in an isotopic proportion lower than nature's 18.60% atomic percent.

5. The isotope-modified Hafnium dielectric of claim 1, wherein the dielectric material comprises 179Hf in an isotopic proportion lower than nature's 13.62% atomic percent.

6. The isotope-modified Hafnium dielectric of claim 1, wherein the dielectric material is a component of an electronic device or a region on an IC (Integrated circuit).

7. The isotope-modified Hafnium dielectric of claim 6, wherein the dielectric material further includes at least one of the chemical elements Zirconium, Titanium, Tantalum, Selenium, and Nitrogen, wherein isotopic proportions of the Zirconium or Tantalum atoms, or of the Selenium or Nitrogen atoms, vary from isotopic proportions of such atoms found in nature.

8. The isotope-modified Hafnium dielectric of claim 6, wherein the dielectric material is interposed between two electrically conductive components.

9. The isotope-modified Hafnium dielectric of claim 6, wherein the dielectric material is used as a capacitor dielectric between two capacitor electrodes.

10. The isotope-modified Hafnium dielectric of claim 6, wherein the dielectric material is a gate dielectric in a MOSFET transistor.

11. The isotope-modified Hafnium dielectric of claim 6, wherein the chemical element Hafnium is deposited on a Silicon or other semiconductor wafer, or other solid surface.

12. An isotope-modified Hafnium dielectric comprising a dielectric material that includes a solid used as an electrical dielectric, the dielectric material comprising a chemical element Hafnium, in which an isotopic distribution of atoms of the Hafnium varies from an isotopic distribution of Hafnium found occurring in natural deposits on earth, wherein the dielectric material comprises 179Hf in a proportion higher than nature's 13.62% atomic percent, and wherein the dielectric material comprises Oxygen, the Oxygen comprising Oxygen-17 isotope in an isotopic proportion higher or lower than nature's 0.038% atomic percent.

13. The isotope-modified Hafnium dielectric of claim 12, wherein the dielectric material is a component of an electronic device or a region on an IC (Integrated circuit).

14. The isotope-modified Hafnium dielectric of claim 12, wherein the dielectric material further includes at least one of the chemical elements Zirconium, Titanium, Tantalum, Selenium, and Nitrogen, wherein isotopic proportions of the Zirconium or Tantalum atoms, or of the Selenium or Nitrogen atoms, vary from isotopic proportions of such atoms found in nature.

15. The isotope-modified Hafnium dielectric of claim 12, wherein the dielectric material is interposed between two electrically conductive components.

16. The isotope-modified Hafnium dielectric of claim 12, wherein the dielectric material is used as a capacitor dielectric between two capacitor electrodes.

17. The isotope-modified Hafnium dielectric of claim 12, wherein the dielectric material is a gate dielectric in a MOSFET transistor.

18. The isotope-modified Hafnium dielectric of claim 12, wherein the chemical element Hafnium is deposited on a Silicon or other semiconductor wafer, or other solid surface.

* * * * *